(12) United States Patent
Benaissa et al.

(10) Patent No.: US 8,609,483 B2
(45) Date of Patent: Dec. 17, 2013

(54) METHOD OF BUILDING COMPENSATED ISOLATED P-WELL DEVICES

(75) Inventors: Kamel Benaissa, Dallas, TX (US); Greg C. Baldwin, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 179 days.

(21) Appl. No.: 12/825,002

(22) Filed: Jun. 28, 2010

(65) Prior Publication Data

US 2010/0327335 A1     Dec. 30, 2010

Related U.S. Application Data

(60) Provisional application No. 61/220,736, filed on Jun. 26, 2009.

(51) Int. Cl.
  *H01L 21/8238* (2006.01)
(52) U.S. Cl.
  USPC .............. 438/210; 438/200; 438/207

(58) Field of Classification Search
  USPC ............... 438/200, 210, 207; 257/300, 378
  See application file for complete search history.

(56) References Cited

U.S. PATENT DOCUMENTS

| | | | |
|---|---|---|---|
| 5,731,619 A * | 3/1998 | Subbanna | 257/374 |
| 6,218,895 B1 * | 4/2001 | De et al. | 327/566 |
| 2009/0159982 A1 * | 6/2009 | Yoon | 257/370 |
| 2009/0221105 A1 * | 9/2009 | Hishiki et al. | 438/16 |

\* cited by examiner

*Primary Examiner* — Walter H Swanson
*Assistant Examiner* — Wilner Jean Baptiste
(74) *Attorney, Agent, or Firm* — Jacqueline J. Garner; Wade J. Brady, III; Frederick J. Telecky, Jr.

(57) ABSTRACT

Electrical device structures constructed in an isolated p-well that is wholly contained within a core n-well. Methods of forming electrical devices within an isolated p-well that is wholly contained within a core n-well using a baseline CMOS process flow.

12 Claims, 14 Drawing Sheets

FIG. 8

METHOD OF BUILDING COMPENSATED ISOLATED P-WELL DEVICES

FIELD OF THE INVENTION

This invention relates to the field of integrated circuits. More particularly, this invention relates to devices in isolated p-wells in integrated circuits.

BACKGROUND OF THE INVENTION

Mobile electronic devices require low standby power for long battery life. One method to reduce standby power is to use the body effect of a transistor that is not in use to reduce the off current. When the body voltage of an NMOS transistor is lowered the body effect causes the vt of the transistor to rise resulting in lower off current. To be able to adjust the body voltage of a NMOS transistor in a conventional CMOS device built on p-type substrate, the NMOS transistor must be constructed in an isolated p-well.

The logic state of NMOS transistors in some circuits may be upset by noise injected into the substrate when transistors switch in close proximity. To avoid this problem it is desirable to place NMOS transistors whose logic state may be upset or the transistors that may cause upset in an isolated p-well.

Other components such as gate to p-well capacitors and NPN bipolar transistors may also be constructed with isolated p-wells. The bottom electrode of gate-to-p-well capacitors built in core p-wells is always at a fixed voltage because the core p-wells are shorted to the p-type substrate whereas the voltage of the bottom electrode of a gate to isolated p-well capacitor may be independently controlled.

The conventional method to form isolated p-wells is to add a deep n-well photoresist pattern and implant to a CMOS process flow. Typically, a CMOS process flow with an isolated p-well has two types of n-wells: core n-wells in which the core PMOS transistors are formed and a deep n-wells in which the isolated p-wells are formed.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

By carefully tailoring the n-well and p-well implant profiles from a conventional CMOS process flow and by implanting the p-well dopants into an area within the n-well the p-well dopants may counter dope the upper region of the n-well forming an isolated p-well fully contained within the n-well. This compensated, isolated p-well is electrically disconnected from the p-type substrate and may be formed in a CMOS process with no added processing steps.

A number of useful electrical components including electrically isolated NMOS transistors, vertical NPN bipolar transistors, and gate to isolated p-well capacitors are formed in the compensated, isolated p-well.

DETAILED DESCRIPTION

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Conventional CMOS manufacturing flows form NMOS transistors in p-wells that are constructed in and electrically shorted to the p-type substrate and also forms PMOS transistors in n-wells that are formed in the p-type substrate. At times it is desirable to form electrical components in a p-well that is electrically isolated from the p-type substrate. For example, the body voltage of NMOS transistors that are constructed in isolated p-wells may be adjusted when the NMOS transistors are not in use to raise the turn on voltage (vt) in order to reduce the transistor off current thereby reducing the standby current of the integrated circuit. In addition, high performance NPN bipolar transistors may be formed using the isolated p-well as the base. Gate to isolated p-well capacitors may also be formed. These capacitors have the advantage of being able to independently control the voltage of both capacitor plates whereas the bottom plate voltage of conventional gate to p-type substrate capacitors is always grounded.

The conventional method to form isolated p-wells is to add a deep n-well photoresist pattern and implant to a baseline CMOS process flow. Typically, a conventional CMOS process flow with an isolated p-well has two types of n-wells: one n-well in which the core PMOS transistors are formed and a second deeper n-well in which the isolated p-wells are formed. The deep n-well is typically formed by adding a deep n-well photoresist pattern and implant step to the baseline CMOS process flow. The depth and dopant profiles of the two n-wells are typically different.

The term "baseline CMOS process flow" refers to a CMOS process flow with that builds the integrated circuit core logic NMOS and PMOS transistors and may also build SRAM memory transistors.

The term "core n-well" and "core p-well" refers to the n-well and p-well formed in a baseline CMOS process flow in which the core logic PMOS and NMOS transistors are constructed. The logic or core transistors refer to the NMOS and PMOS transistors that operate at power supply voltage and constitute the vast majority of transistors in an integrated circuit.

The term "ci-p-well" refers to a compensated, isolated p-well formed by carefully optimizing the core n-well and core p-well implant profiles so that an isolated p-well (ci-p-well) may be formed within a core n-well by implanting the core p-well implant into an area within the core n-well. The core p-well implant compensates the n-type dopant in the upper region of the core n-well forming a ci-p-well wholly contained within the core n-well and electrically isolated from the p-substrate.

The term "iso-device" refers to a device that is constructed in a ci-p-well.

FIG. 1A through 1G briefly describes the major steps in a process flow that builds a transistor in an isolated p-well (iso-NMOS) according to an embodiment of the instant invention. A ci-p-well is formed by counterdoping the n-type dopant near the surface of the n-well with p-type dopants used to form the core p-well. In this manner, an isolated p-well may be formed within the n-well regions without additional masking and implantation steps thus saving significant manufacturing cost and cycle time.

Figure 1A:
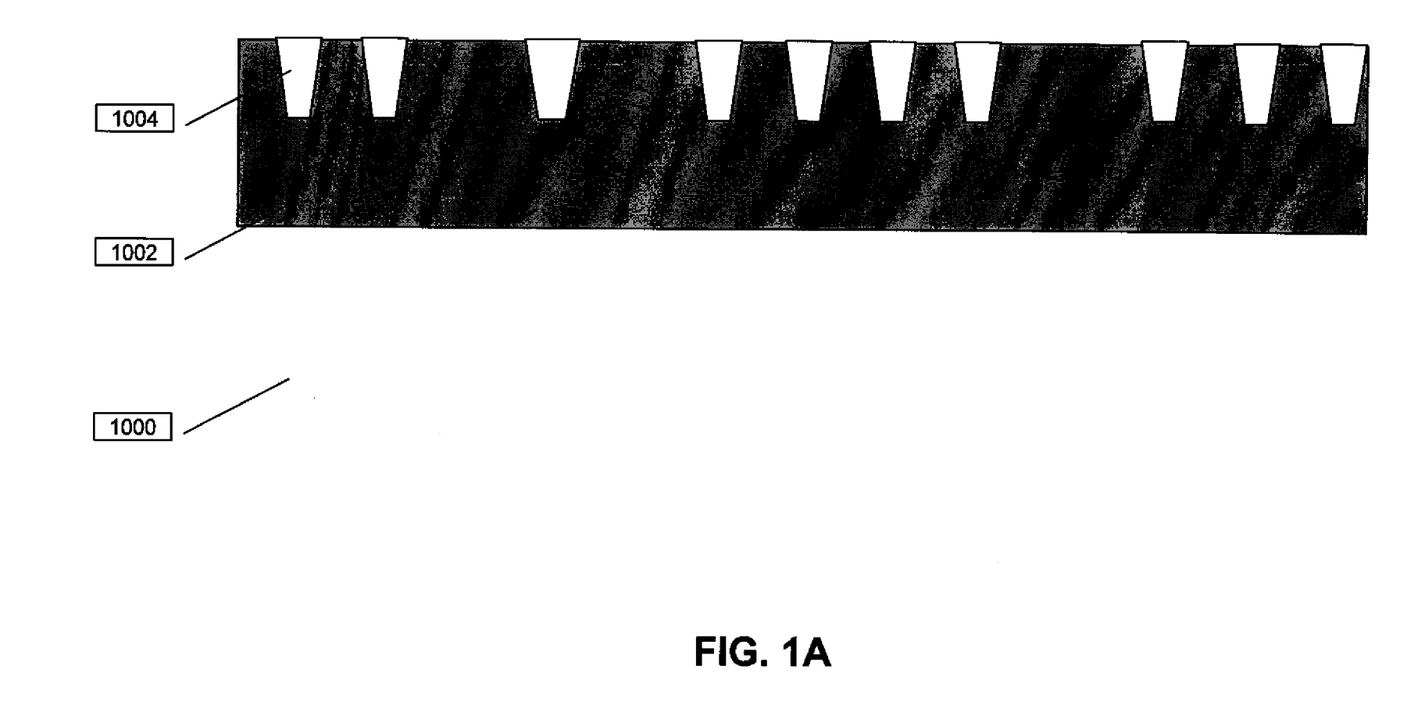
FIG. 1A through 1G are illustrations of steps in the fabrication of an isolated NMOS transistor incorporating this invention.

Shown in FIG. 1A is an integrated circuit 1000 that is processed through shallow trench isolation (STI). STI regions 1004 are formed in a p-type substrate 1002 using well known methods.

Figure 1B:
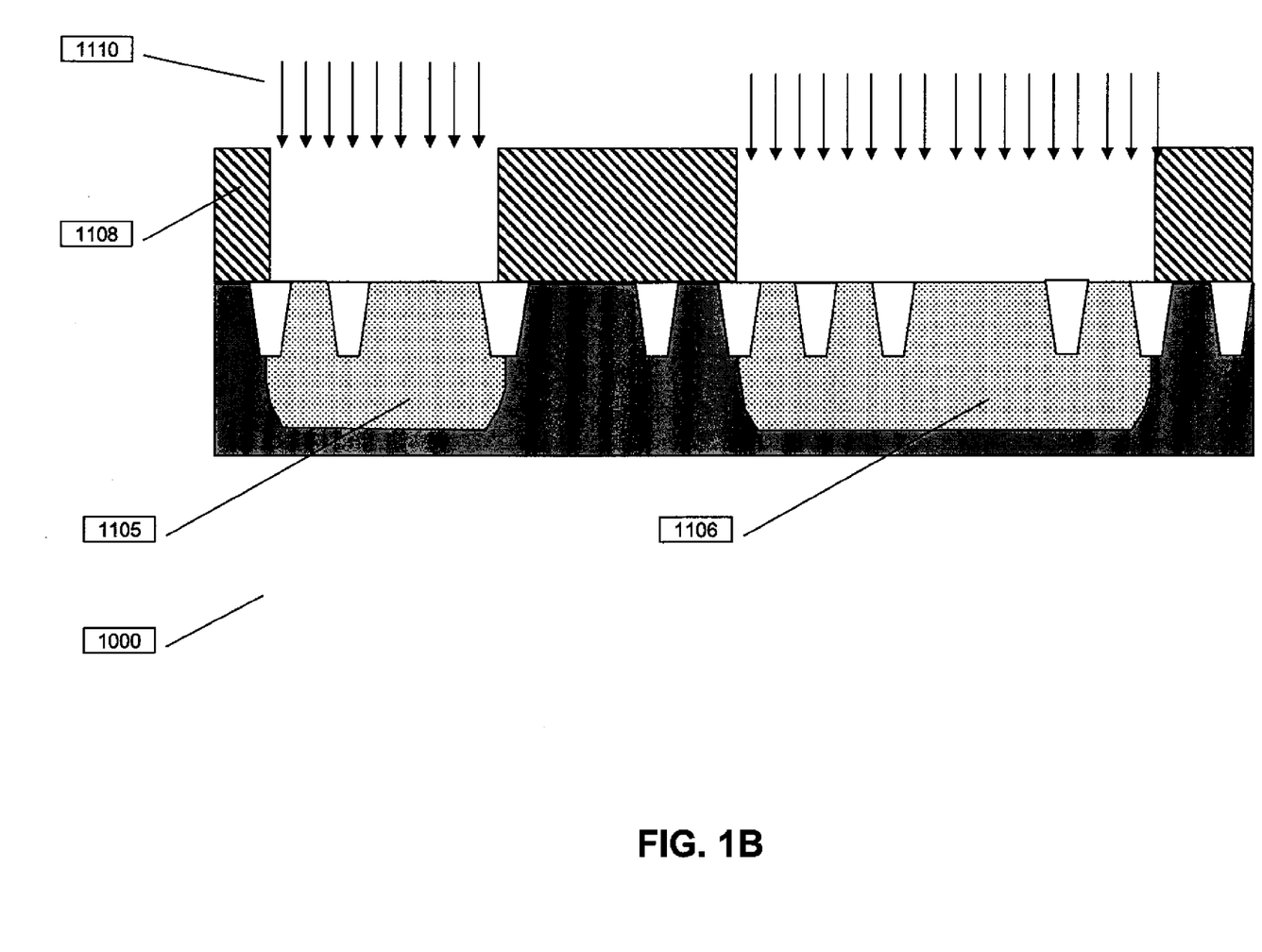

In FIG. 1B, an n-well photoresist pattern 1108 is formed over the integrated circuit 1000. The n-well dopant 1110, indicated by the arrows, is implanted to form an n-well 1105 in which core PMOS transistors may be formed and n-well 1106 in which an isolated NMOS transistor (iso-NMOS) may be formed. The n-well implant 1110 is typically a series of chained implants of phosphorus and possibly arsenic to counter dope the p-type substrate and form n-wells 1105 and 1106. The series of chained implants typically are a low dose, low energy implant to set the turn on voltage (vt) of core PMOS transistors, a slightly higher dose and energy punch through implant to increase the base doping of the parasitic npn bipolar transistor that forms under each core PMOS transistor, an even higher dose and energy channel stop implant to raise the vt of the parasitic PMOS transistor formed under the STI region 1004, and a high dose, high energy implant to form a retrograde well profile with low resistance at the bottom of the n-wells 1105 and 1106. The dose and energy of these n-type implants along with the dose and energy of comparable p-type vt, punchthrough, channel stop, and p-well implants are co optimized according to this invention to form an isolated p-well structure (ci-p-well) when both the n-well and p-well series of implants are implanted into the same n-well, 1106 region.

Figure 1C:
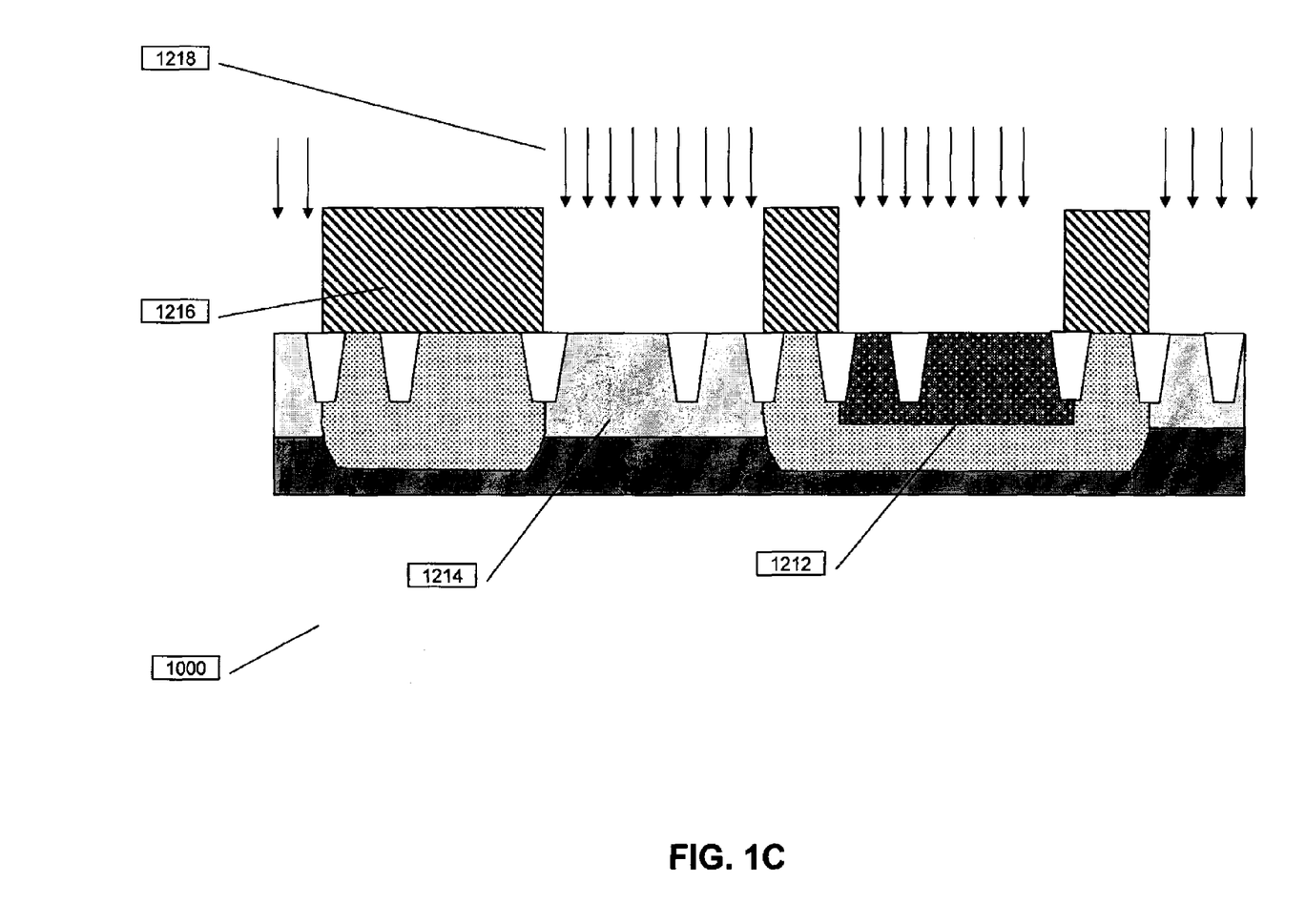

Referring now to FIG. 1C, the n-well pattern 1108 has been removed and a p-well photo resist pattern 1216 has been formed on the surface of the integrated circuit 1000 with openings over the areas outside the n-well region where p-well regions are desired 1214 and also over a region within the n-well 1106 where an isolated p-well 1212 is formed. Along with the n-well implants, the p-well series of implants 1218 are carefully co optimized so that in addition to the formation of p-well regions 1214 outside the n-well 1105 and 1106 regions, a region within n-well 1106 is counterdoped to form an electrically isolated counterdoped p-well (ci-p-well) 1212. A core PMOS transistor is later constructed within n-well 1105 and an iso-NMOS transistor is later constructed in n-well 1106. After the wells have been implanted, the pattern is removed and the wells are annealed to activate the well dopants and to heal any implant damage that may have occurred.

Figure 1D:
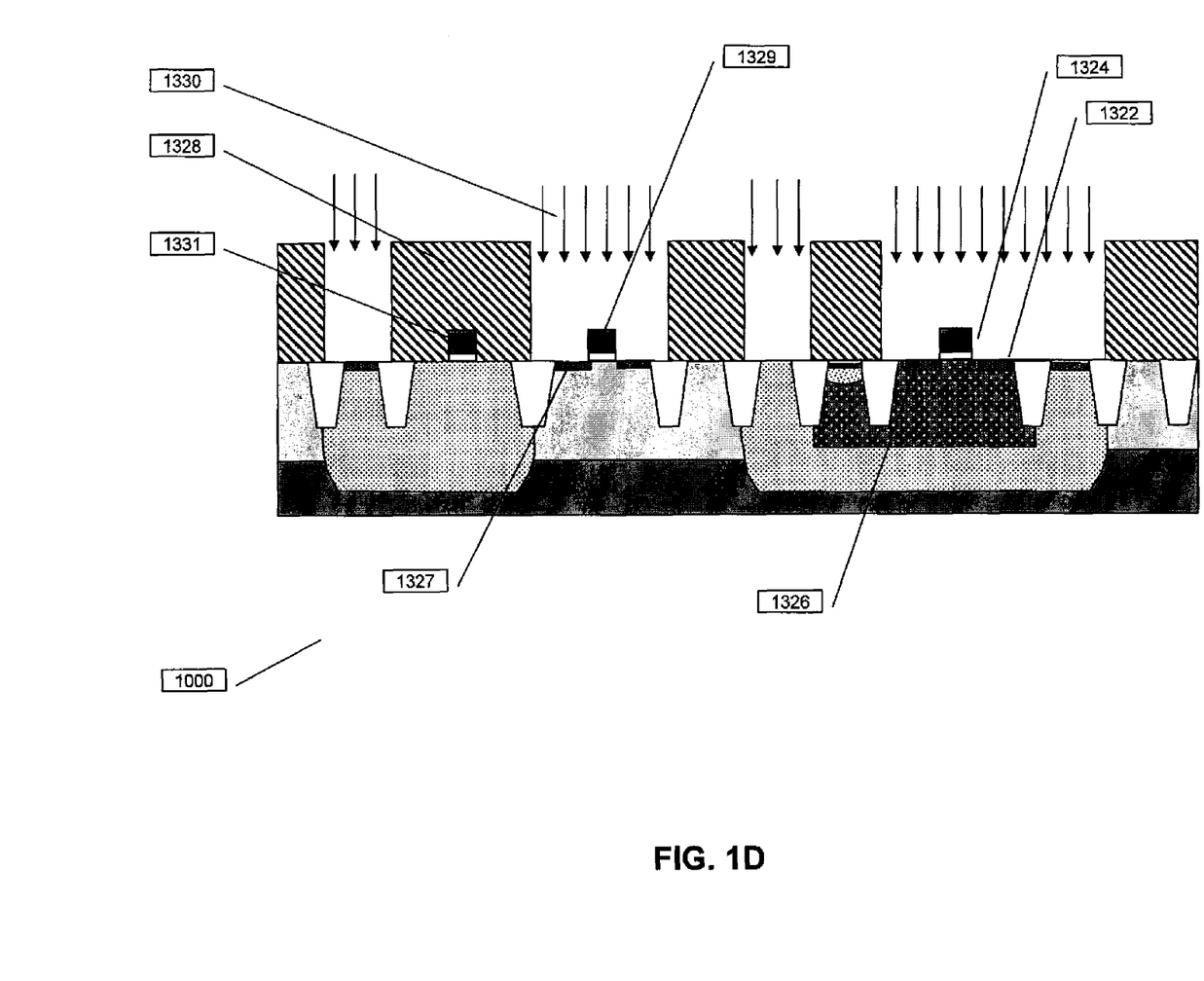

FIG. 1D shows the integrated circuit 1000 after it is processed through steps to form gate dielectric 1322 and a gate 1324 using well known processes. The gate dielectric 1322 and gate stack 1324 form the gate of the iso-NMOS transistor and the gates of the core NMOS 1329 and PMOS transistors 1331. The gate dielectric 1322 may be oxide, oxynitride, or a high dielectric constant (high-k) material. The gate stack 1324 may be doped or undoped polysilicon, or a conductive material such as a silicide or a metal. Other well known processing steps such as the formation of SiGe source and drains and the formation of offset spacers are commonly performed but are not shown so as not to obscure the instant invention. An extension photoresist pattern 1328 has been formed on the surface of the integrated circuit 1000 with openings over the source and drain of the iso-NMOS transistor gate 1324 and over source and drain of the core NMOS transistor 1329 to form source and drain extensions 1327 on the core 1329 and source and drain extensions 1326 on the iso-NMOS transistor 1324.

Figure 1E:
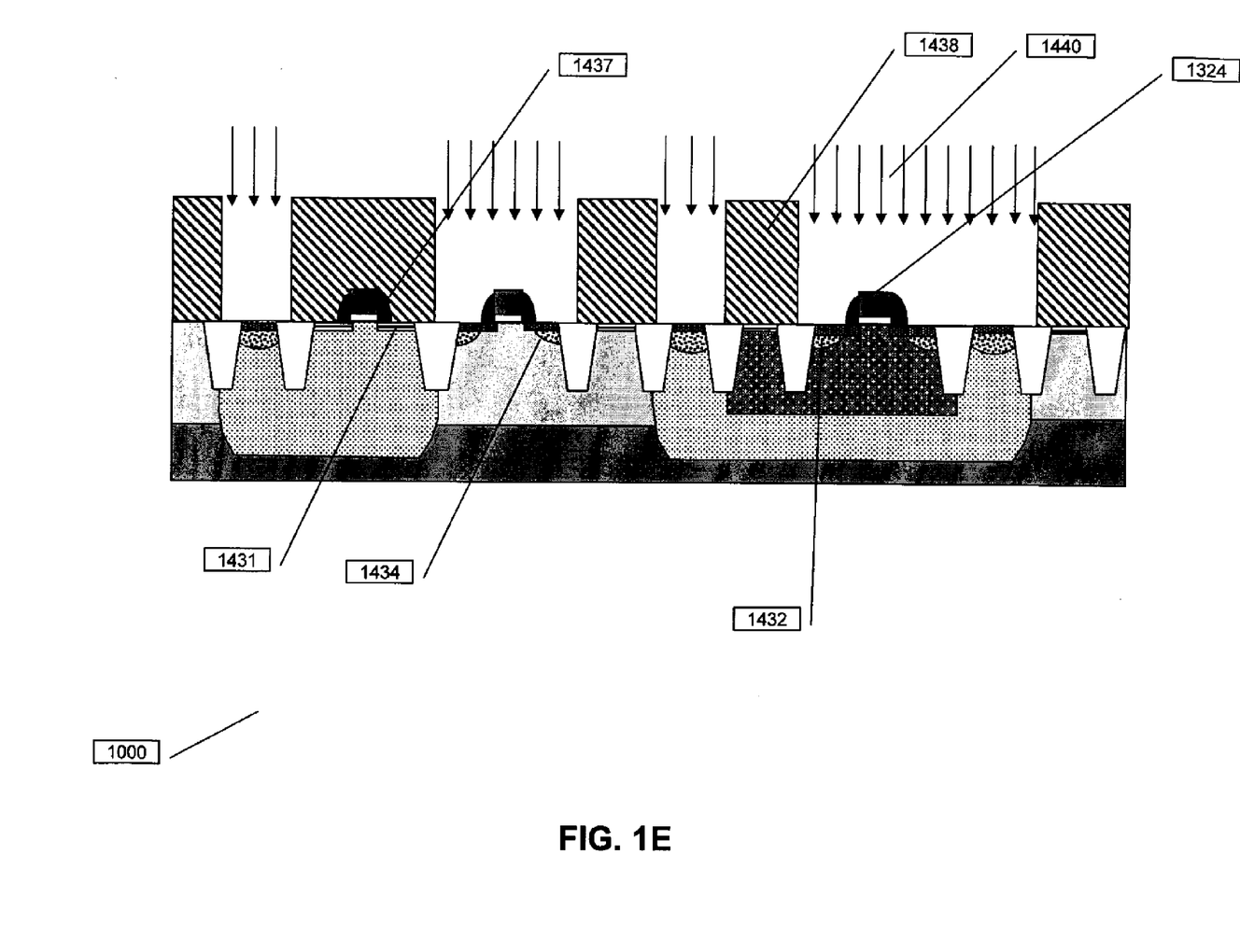

FIG. 1E shows the integrated circuit 1000 after implantation of p-type extensions 1431 on core PMOS transistor 1331 and formation of sidewalls 1436 and 1437 on the iso-NMOS transistor 1324 and on the core NMOS 1329 and core PMOS 1331 transistors. Following the formation of the sidewalls 1436 and 1437, an NSD photoresist pattern 1438 is formed on the surface of the integrated circuit 1000 with openings to allow the NSD implant 1440 into the source and drain 1432 regions of the iso-NMOS transistor and also the source and drain regions 1434 of the core NMOS transistor 1329.

Figure 1F:
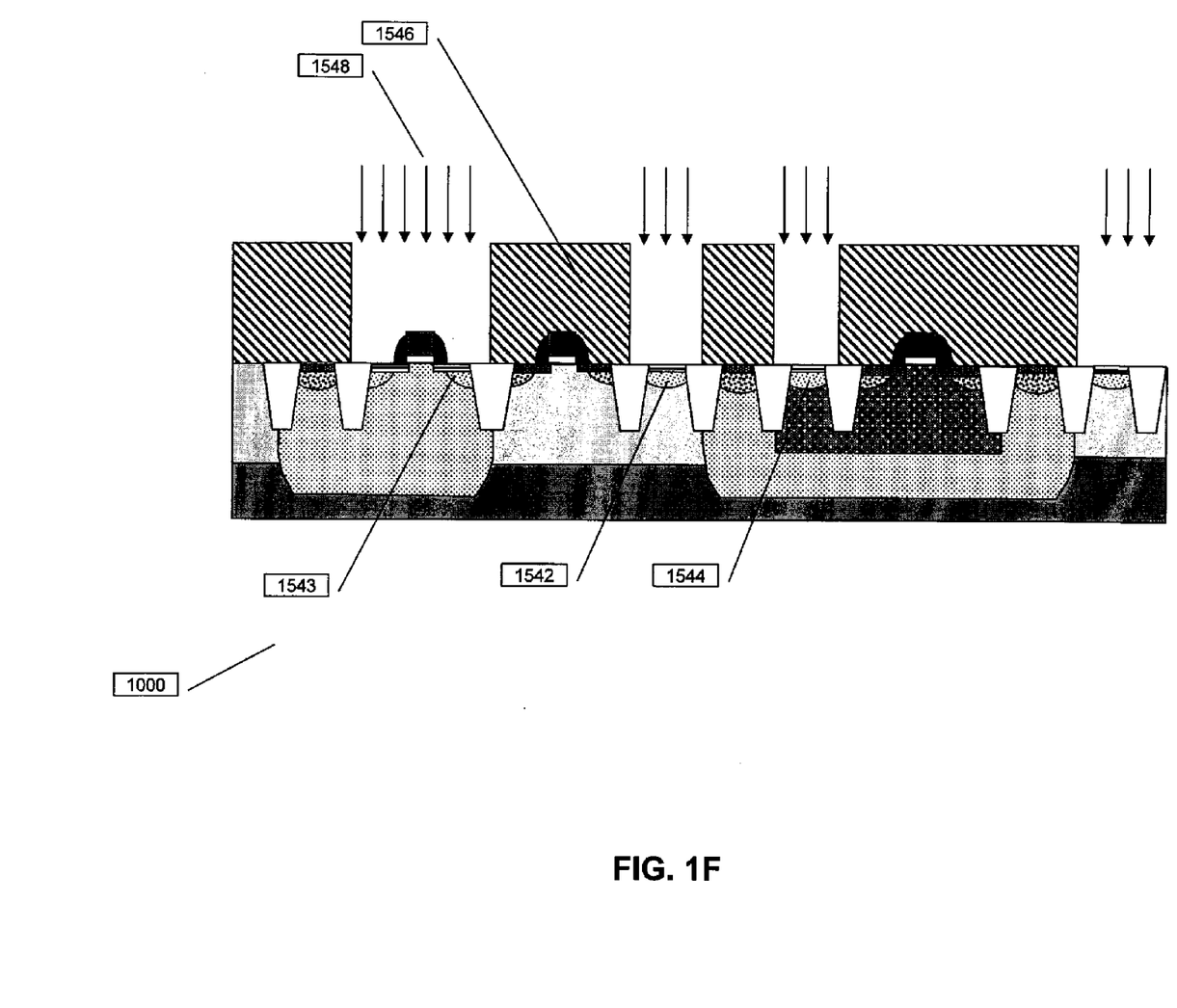

Referring now to FIG. 1F, the NSD photoresist pattern 1438 is removed and a PSD photoresist pattern 1546 with openings over the p-well contact regions 1542 and over the ci-p-well contact region 1544 is formed on the surface of the integrated circuit 1000. P-type implant 1548, usually boron plus BF2, forms the source and drain regions 1543 of the core PMOS transistor 1331 as well as the p-well and the ci-p-well contact regions, 1542 and 1544. Other species such as germanium may be added for preamorphization purposes or carbon to retard interstitial diffusion for sharper junction formation may also be added.

Figure 1G:
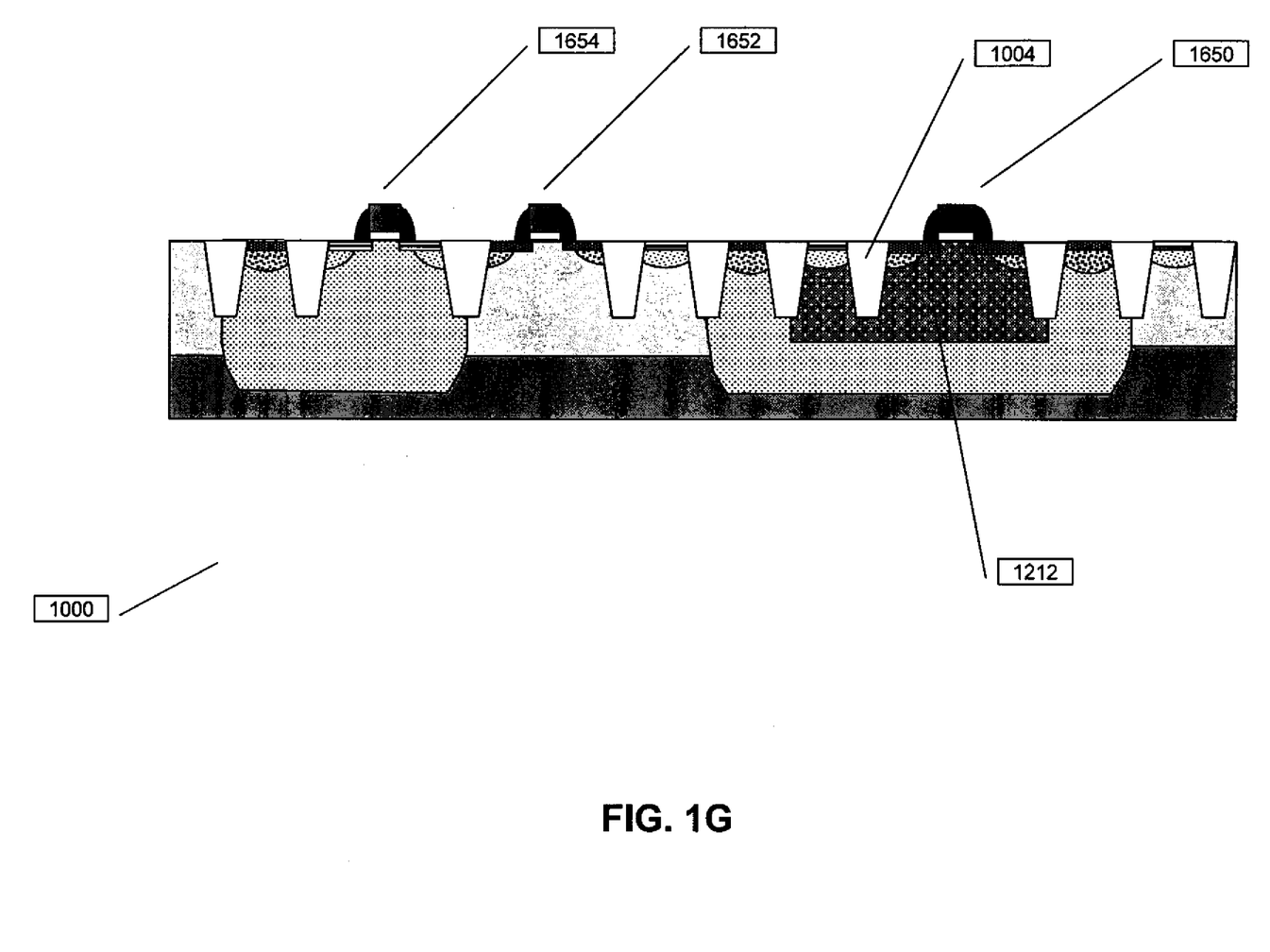

The iso-NMOS transistor is shown in FIG. 1G after the PSD photoresist pattern 1546 is removed and the implanted dopants annealed. Additional well known processing steps including silicide formation, contact formation, and interconnect formation among others follow to complete the integrated circuit 1000 processing. Iso-NMOS transistor 1650 is formed using the baseline process steps used to form core NMOS 1652 and core PMOS 1654 transistors. This adds useful functionality to the integrated circuit 1000 at no additional process cost or cycle time.

The ci-p-well 1212 shown in FIG. 1G extends below the STI 1004. The ci-p-well contact region 1546 is electrically isolated from the iso-NMOS transistor source and may be used to independently control the body potential of the isolated NMOS transistor. For example, the body potential may be lowered when the iso-NMOS transistor is off to raise the vt thus reducing transistor standby current.

Figure 2:
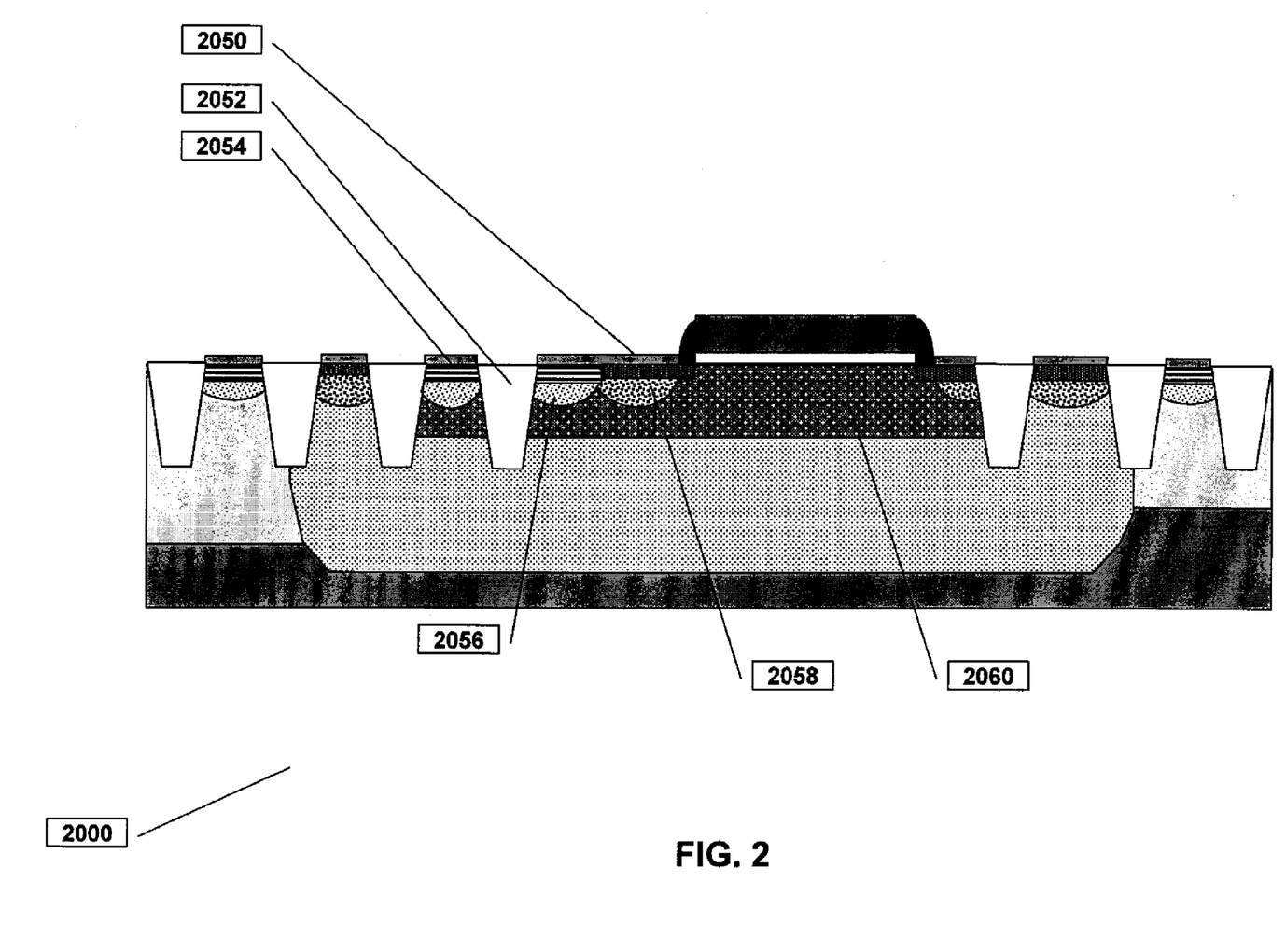
FIG. 2 is an isolated NMOS transistor formed according to an embodiment.
Figure 3:
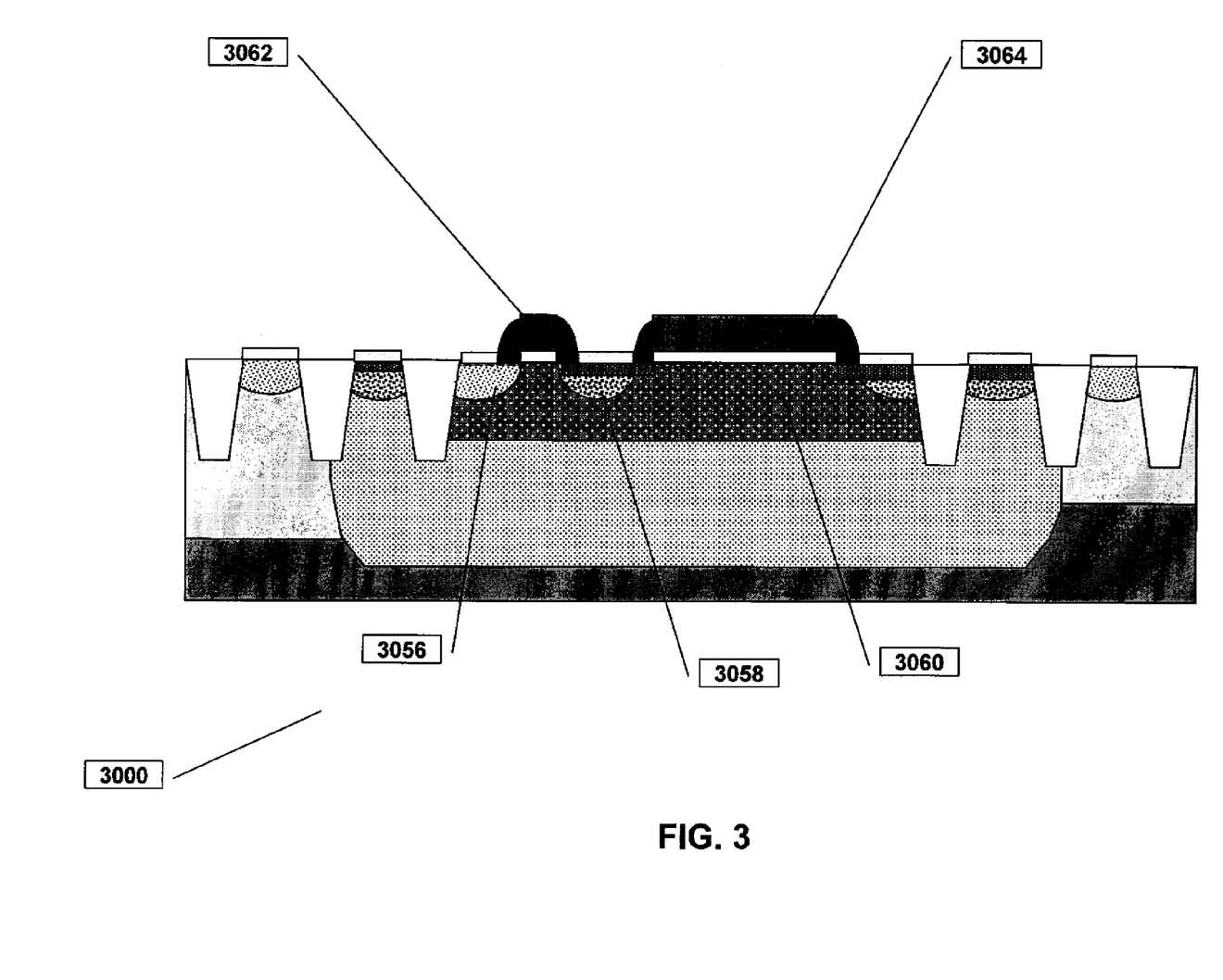
FIG. 3 is an isolated NMOS transistor formed according to an embodiment.
Figure 4:
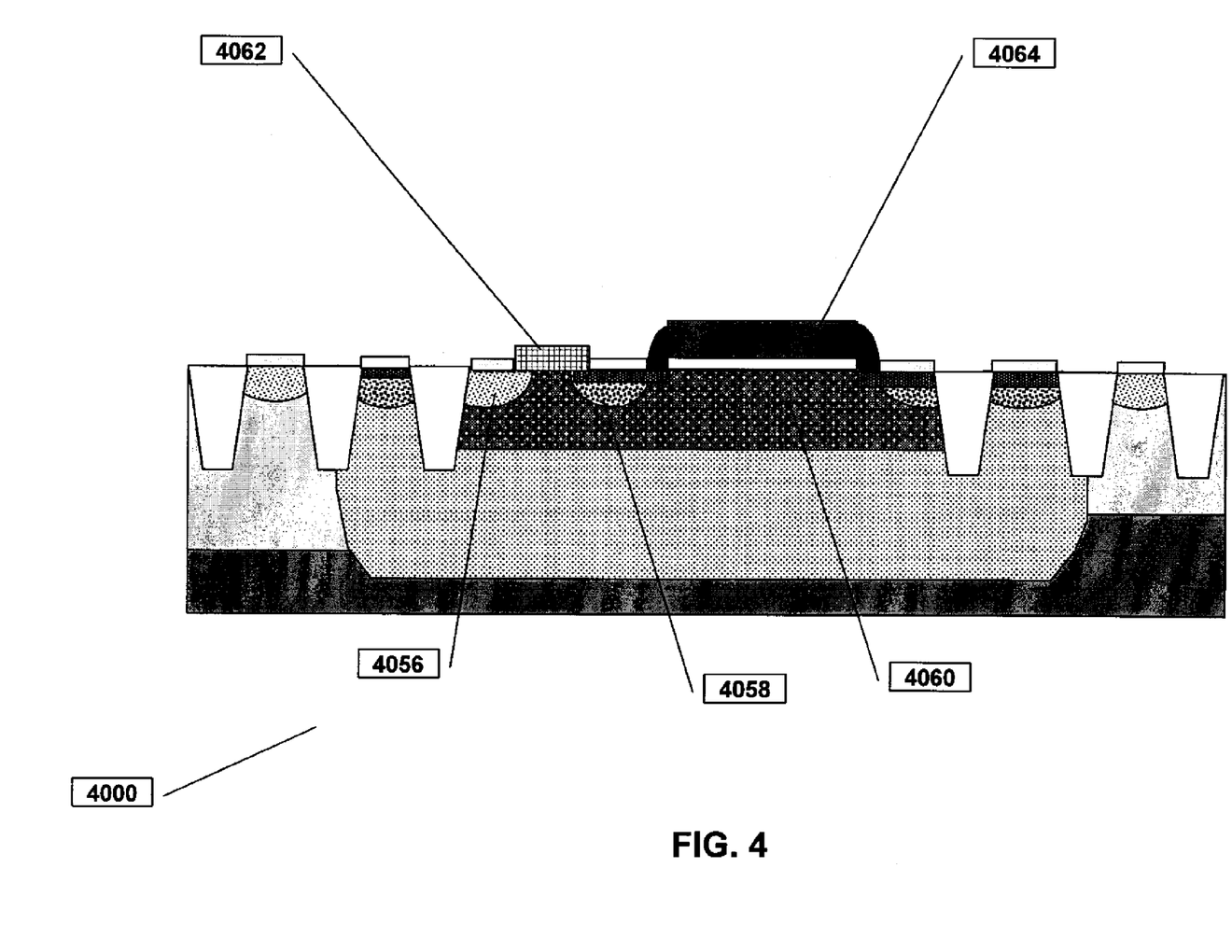
FIG. 4 is an isolated NMOS transistor formed according to an embodiment.

FIGS. 2, 3, and 4 show additional embodiments of iso-NMOS transistors built according to embodiments of the instant invention. As integrated circuits are scaled smaller, n-wells and ci-p-wells get shallower. In these example embodiments, the ci-p-well 2060 is shallower than the STI isolation region 2052, as shown in FIG. 2. Electrical continuity between the ci-p-well contact 2054 and the ci-p-well 2060 is broken by STI region 2054. In this embodiment, to provide electrical contact to the body of the iso-NMOS transistor, a P+ region 2056 is formed adjacent to the N+ source 2058. Silicide 2050 shorts the P+2056 ci-p-well contact and N+ source 2058 regions together. In this embodiment, the source 2058 and body 2060 potential of the iso-NMOS transistor are the same.

When the ci-p-well 3060 is shallower than the STI it may be desirable to control the body potential of the iso-NMOS transistor independently of the source. For example, when the isolated NMOS transistor is not in use the body potential may be lowered causing the turn on voltage (vt) to rise. This reduces the isolated NMOS transistor off current thereby reducing the standby power of the integrated circuit. FIGS. 3 and 4 show embodiments of iso-NMOS with a ci-p-well contact that is isolated electrically from the source contact. In FIG. 3, a gate stack geometry 3062 is formed adjacent to the source 3058 at the same time that the iso-NMOS gate 3064 is formed. This gate stack geometry separates the ci-p-well contact 3056 from the source contact 3058 preventing them from shorting together during silicidation. In this embodiment, the source and body potential of the iso-NMOS transistor may be independently controlled. No additional photolithography steps and no additional implantation steps are needed to form this iso-NMOS transistor.

In FIG. 4 a silicide block region 4062 prevents the ci-well contact 4056 from becoming shorted to the source 4058 during silicidation. One common method to provide a silicide blocked region 4062 is to deposit a dielectric and to pattern and etch it to block silicide formation. This may add one dielectric deposition, one photolithography step, and one dielectric etching step unless the silicide block process is already in the baseline CMOS manufacturing flow.

Figure 5:
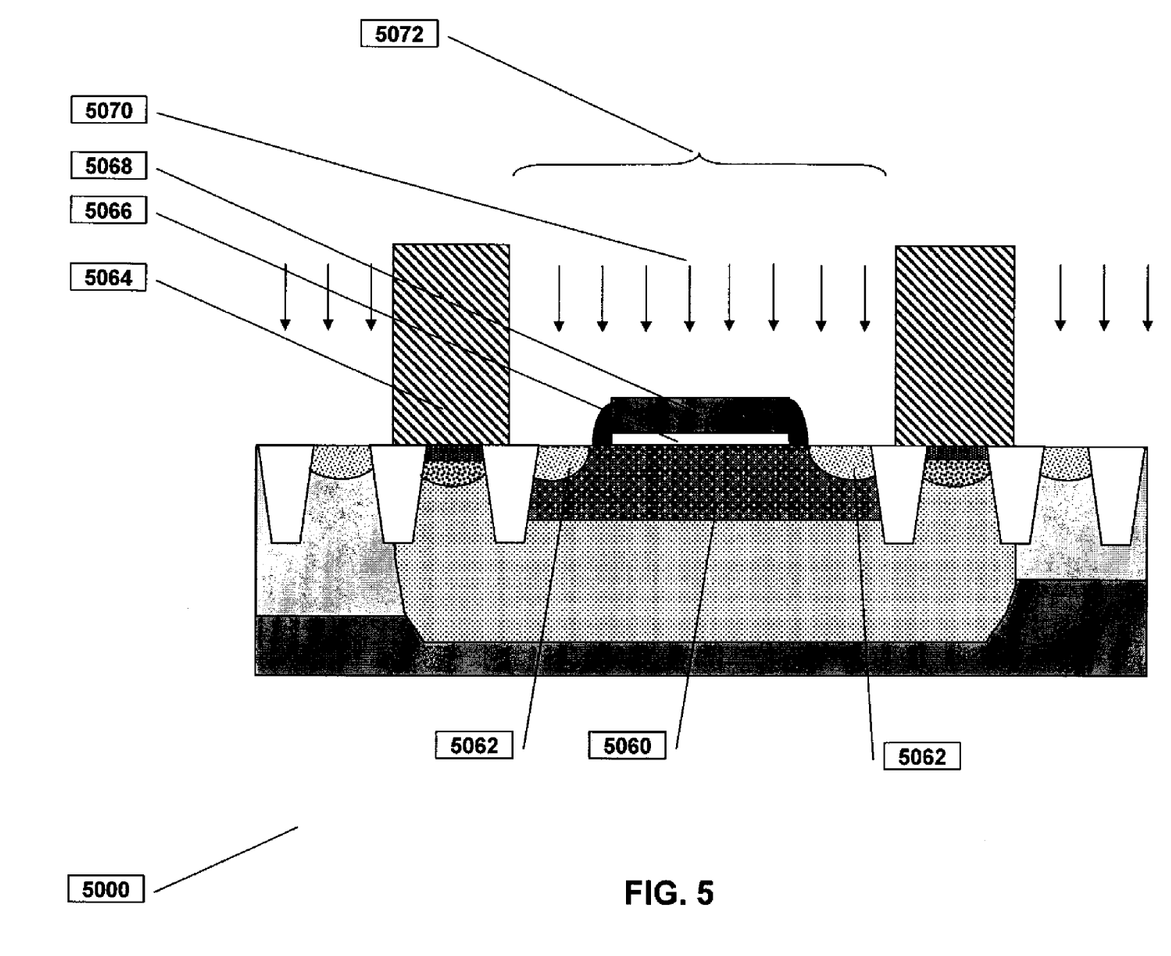
FIG. 5 is a cross-section of a gate to isolated p-well capacitor formed according to an embodiment.

The embodiment in FIG. 5 illustrates the formation of an iso-capacitor with the gate material 5068 as the top capacitor plate, the gate dielectric 5066 as the capacitor dielectric, and the ci-p-well 5060 as the capacitor bottom plate. The manufacturing steps follow the same flow as for building the iso-NMOS transistor except that the NSD implant is blocked from the capacitor opening 5072 and is open during the PSD photoresist patterning 5064 and implantation 5070 steps. This implants p-type dopant into the gate 5066 which forms the top plate of the capacitor and which may be polysilicon, and also into the ci-p-well contacts 5062. This p-type iso-capacitor has the advantage that the voltage of both the bottom and top plates may be independently controlled. Only the voltage of the top plate of conventional p-type gate to core p-well capacitor may be controlled since the core p-well is shorted to the substrate and is always at ground potential in conventional CMOS integrated circuits. This iso-capacitor may be formed using the baseline processing steps in a CMOS manufacturing flow with no added photolithography and implantation steps thus adding a new device with no additional cost.

Figure 6:
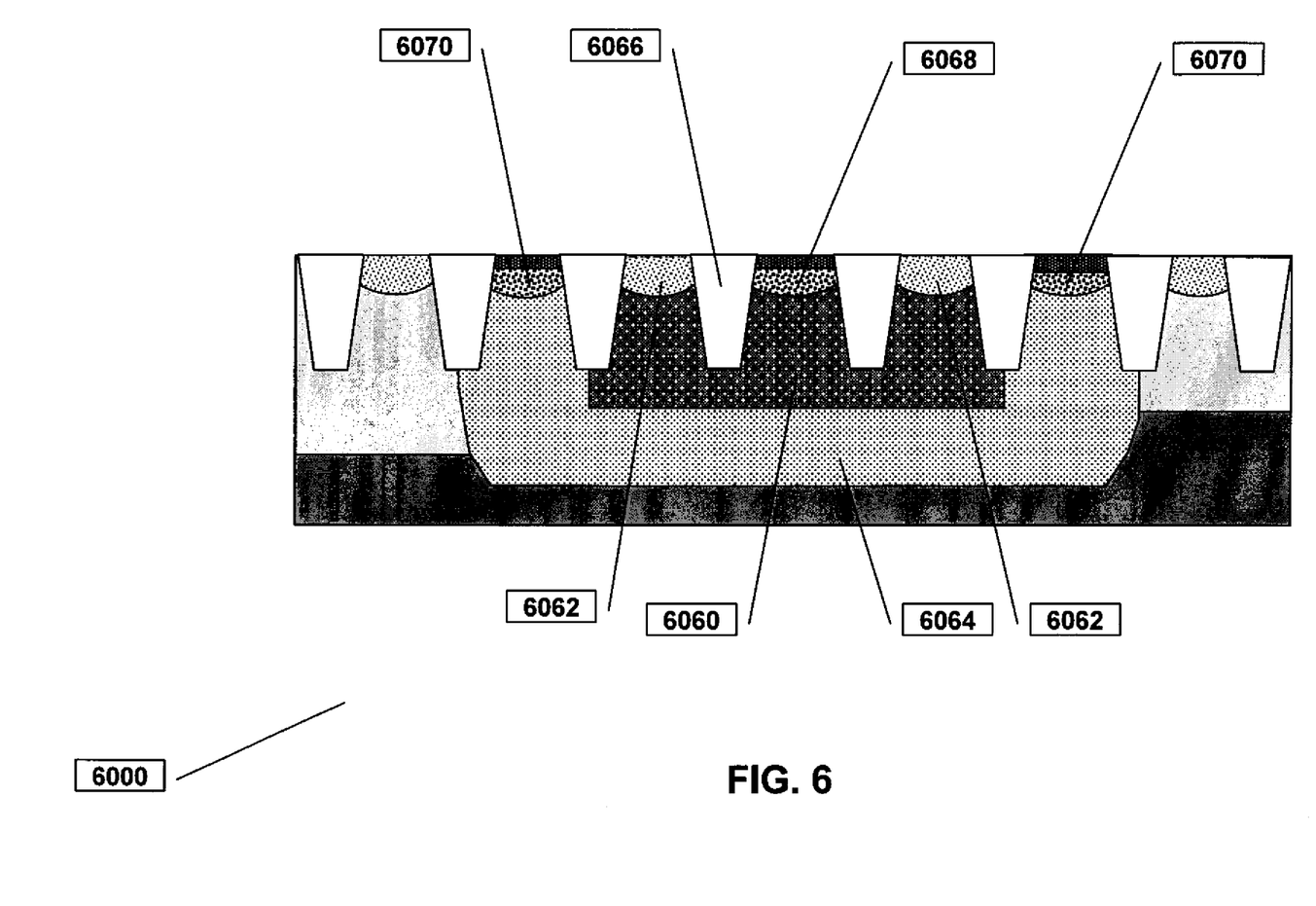
FIG. 6 is a cross-section of an isolated vertical NPN bipolar transistor formed according to an embodiment.

FIG. 6 illustrates the formation of a vertical iso-npn bipolar transistor (iso-npn) 6000. The emitter 6068 is formed with the NSD implant, the base is formed using the ci-p-well 6060, and the collector is formed using the core n-well 6064. The base voltage is controlled using the ci-p-well 6060 contacts 6062. The collector 6064 voltage is controlled using the n-well contacts, 6070. The ci-p-well 6060 in FIG. 6 extends below the STI 6066, so there is electrical continuity between the ci-p-well contacts 6062 and the base of the vertical iso-npn transistor 6060. This vertical iso-npn bipolar transistor (iso-npn) may be formed using the baseline processing steps in a baseline CMOS manufacturing flow with no added photolithography and implantation steps. The gain of this iso-npn may be optimized by co optimizing the profiles of the core NMOS and core PMOS well implant profiles.

Figure 7:
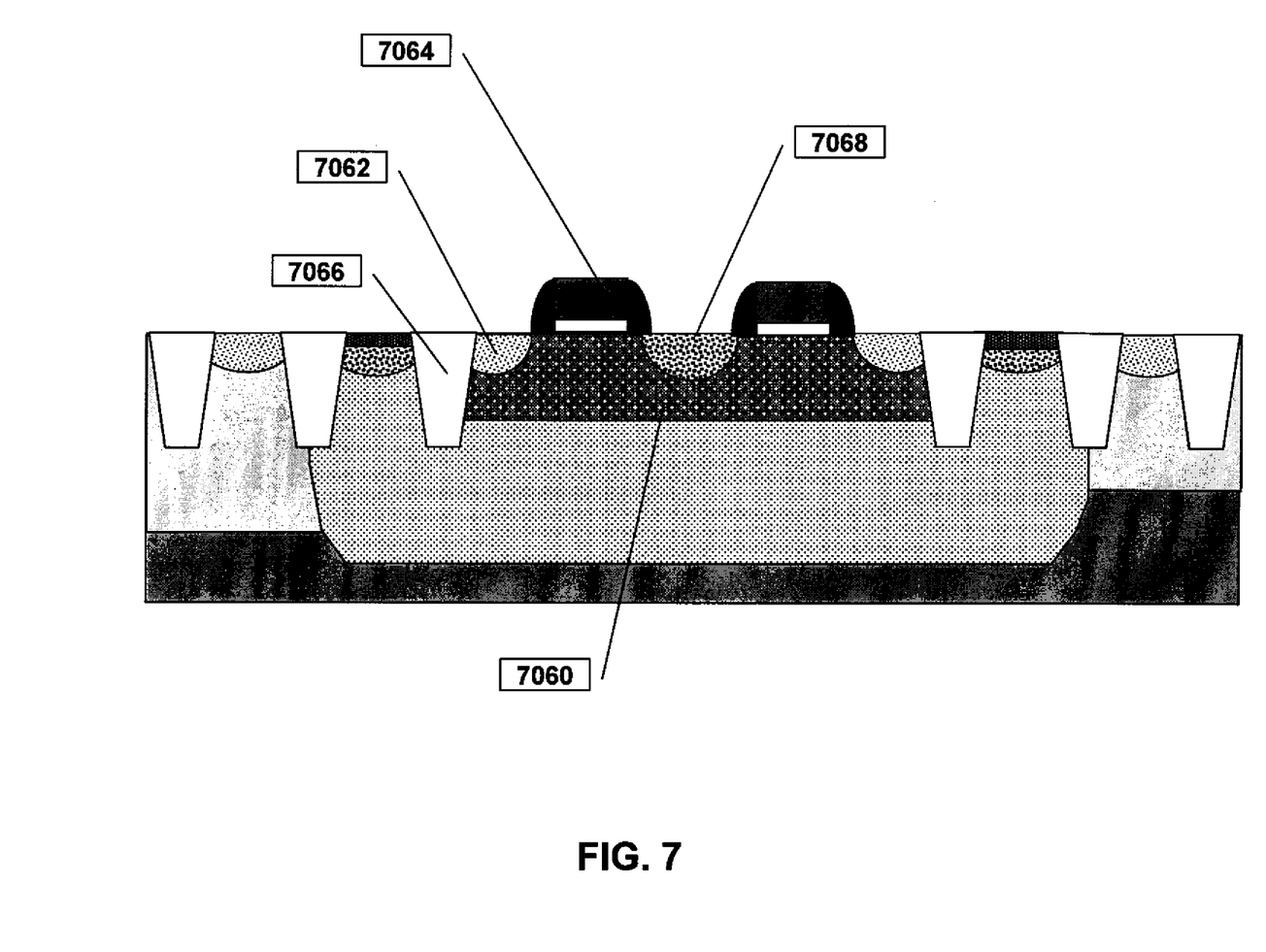
FIG. 7 is a cross-section of an isolated vertical NPN bipolar transistor formed according to an embodiment.
Figure 8:
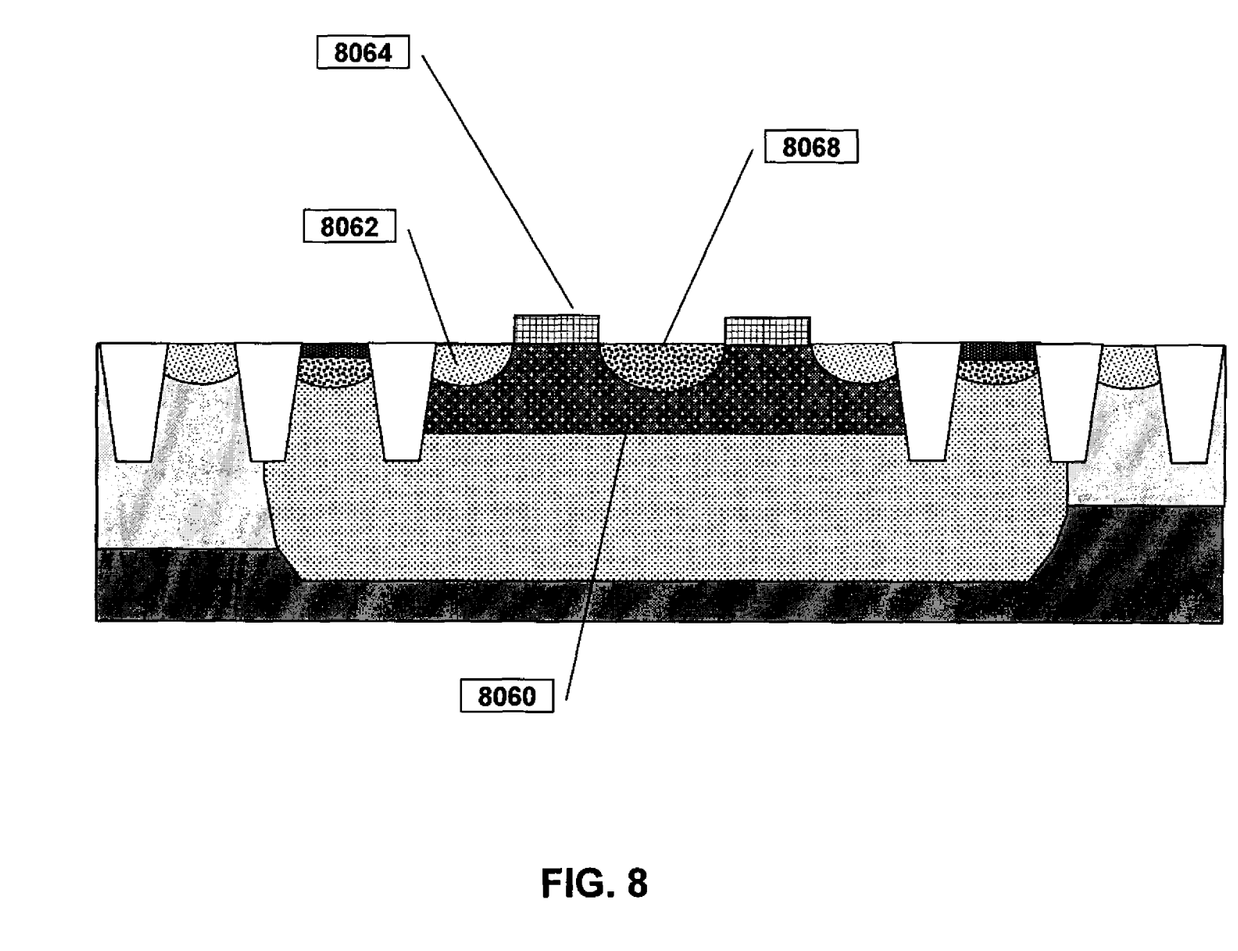
FIG. 8 is a cross-section of an isolated vertical NPN bipolar transistor formed according to an embodiment.

Two methods of forming contacts to the iso-npn bipolar transistor when the ci-p-well 7060 is shallower than the STI 7066 are demonstrated in FIGS. 7 and 8. In FIG. 7, a gate stack 7064 is patterned and etched simultaneously with the core transistor gate stacks so that is surrounds the emitter area 7068 and prevents the ci-p-well contact 7062 from shorting to the emitter 7068 during silicidation.

In FIG. 8, silicide block 8064 surrounds the emitter 8068 and prevents silicide from shorting the emitter 8068 to the ci-p-well contact 8062. This iso-npn bipolar transistor may be formed using a CMOS process flow with no additional manufacturing processing cost or cycle time. The gain of this vertical iso-npn may be optimized by co optimizing the implant profiles of the core n-well and core p-well implants to form the desired base width and dopant profile.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit containing an iso-device comprising:
    simultaneously forming a first n-well and a second n-well, said first n-well and said second n-well having a same depth and dopant concentration;
    simultaneously forming a first p-well and a ci-p-well, wherein said ci-p-well is formed within said second n-well;
    forming a core NMOS transistor in said first p-well;
    forming a core PMOS transistor in said first n-well; and
    forming said iso-device in said ci-p-well wherein said iso-device is an iso-capacitor further comprising steps of:
        simultaneously with forming a gate dielectric of core NMOS transistor, forming a capacitor dielectric of said iso-capacitor;
        simultaneously with forming a gate of said core NMOS transistor, forming a top plate of said iso-capacitor; and
        simultaneously with forming a p-type source and drain on said core PMOS transistor forming a ci-p-well contact.

2. The method of claim 1, wherein dopant profiles of said first n-well and said first p-well are optimized so that said ci-p-well is formed within said second n-well.

3. The method of claim 2, wherein said iso-device is an iso-NMOS transistor further comprising the steps of:
    simultaneously with forming the core NMOS and core PMOS transistors, forming a gate of the iso-NMOS transistor;
    simultaneously with forming n-type source and drain extensions on said core NMOS transistor, forming the n-type source and drain extensions on said iso-NMOS transistor; and
    simultaneously with forming the n-type source and drain on said core NMOS transistor forming the n-type source and drain on said iso-NMOS transistor.

4. The method of claim 1, wherein said iso-device is an iso-npn further comprising:

forming a silicide blocked region adjacent to an n-type emitter of said iso-npn; and forming a contact to said ci-p-well wherein said contact is separated from said n-type emitter by said silicide blocked region.

5. The method of claim 4, wherein said ci-p-well is deeper than STI and wherein said silicide blocked region is formed using an STI geometry.

6. The method of claim 4, wherein said silicide blocked region is formed using a silicide block dielectric.

7. The method of claim 4, wherein said silicide blocked region is formed by depositing, patterning, and etching a gate stack geometry simultaneously with depositing, patterning, and etching gates stack of said core NMOS and said core PMOS transistors.

8. A method of forming an integrated circuit containing an iso-device comprising:
  simultaneously forming a first n-well and a second n-well, said first n-well and said second n-well a same depth and dopant concentration;
  simultaneously forming a first p-well and a ci-p-well, wherein said ci-p-well is formed within said second n-well, wherein dopant profiles of said first n-well and said first p-well are optimized so that said ci-p-well is formed within said second n-well;
  forming a core NMOS transistor in said first p-well;
  forming a core PMOS transistor in said first n-well; and
  forming said iso-device in said ci-p-well, wherein said iso-device is an iso-NMOS transistor and forming said iso-device comprises steps of:
    simultaneously with forming gates of the core NMOS and core PMOS transistors, forming a gate of an iso-NMOS transistor;
    simultaneously with forming n-type source and drain extensions on said core NMOS transistor, forming n-type source and drain extensions on said iso-NMOS transistor; and
    simultaneously with forming the n-type source and drain on said core NMOS transistor, forming n-type source and drain on said iso-NMOS transistor;
    forming a silicide blocked region adjacent to said n-type source contained within said ci-p-well; and
    forming a contact to said compensated ci-p-well wherein said contact is separated from said n-type source by said silicide blocked region.

9. The method of claim 8, wherein said ci-p-well is deeper than an STI and wherein said silicide blocked region is formed using an STI geometry.

10. The method of claim 8, wherein said silicide blocked region is formed using a silicide block dielectric.

11. The method of claim 8, wherein said silicide blocked region is formed by depositing, patterning, and etching a gate stack simultaneously with depositing, patterning, and etching the gate stack of said core NMOS transistor.

12. A method of forming an integrated circuit containing an iso-NMOS transistor comprising:
  simultaneously forming a first core n-well and a second n-well in a p-type substrate, said first core n-well and said second n-well having a same depth and dopant concentration;
  simultaneously forming a first core p-well and a ci-p-well, wherein said ci-p-well is formed within said second n-well and said first core p-well is formed in the p-type substrate outside of both said first core n-well and said second n-well;
  forming a core NMOS transistor in said first core p-well;
  forming a core PMOS transistor in said first core n-well; and
  forming said iso-NMOS transistor in said ci-p-well wherein said iso-device is an iso-capacitor further comprising steps of: simultaneously with forming a gate dielectric of core NMOS transistor, forming a capacitor dielectric of said iso-capacitor; simultaneously with forming a gate of said core NMOS transistor, forming a top plate of said iso-capacitor; and simultaneously with forming a p-type source and drain on said core PMOS transistor forming a ci-p-well contact.

\* \* \* \* \*